(12) United States Patent
Suwa et al.

(10) Patent No.: US 8,526,267 B2
(45) Date of Patent: Sep. 3, 2013

(54) ELECTRONIC DEVICE

(75) Inventors: Motoo Suwa, Kanagawa (JP);
Toshikazu Matsuda, Nanae (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 176 days.

(21) Appl. No.: 13/170,663

(22) Filed: Jun. 28, 2011

(65) Prior Publication Data

US 2011/0317475 A1 Dec. 29, 2011

(30) Foreign Application Priority Data

Jun. 28, 2010 (JP) .................. 2010-146142

(51) Int. Cl.
*G11C 8/00* (2006.01)

(52) U.S. Cl.
USPC ............. 365/233.1; 365/233.13; 365/149

(58) Field of Classification Search
USPC ................ 365/233.1, 233.13, 149
See application file for complete search history.

(56) References Cited

U.S. PATENT DOCUMENTS 7,623,397 B2 * 11/2009 Itano et al. ............... 365/194

OTHER PUBLICATIONS

JEDEC Standard No. 21C, Release 18A Revision 1.0, 4.20.18-204-Pin DDR3 SDRAM Unbuffered SO-DIMM Design Specification, pp. 4.20.18-1 to 4.20.18-66, Feb. 2009.
JEDEC Standard No. 21C, Release 18 Revision 2.5, 4.20.11-200-Pin DDR2 SDRAM Unbuffered SO-DIMM Design Specification, p. 4.20.11-01 to 4.20.11-60, Jul. 2008.

* cited by examiner

*Primary Examiner* — Son Dinh
*Assistant Examiner* — Nam Nguyen
(74) *Attorney, Agent, or Firm* — Miles & Stockbridge P.C.

(57) ABSTRACT

To suppress a timing window from being narrowed undesirably by the harmonic component of a signal output from a semiconductor component without imposing a burden on the semiconductor component that controls access.
A capacitor element is arranged in series with a specific transmission path branching from a predetermined node of a signal transmission path and reaching to a ground plane, the signal transmission path supplying an enable control signal that indicates the validity of a clock signal and a command and address signal output from a semiconductor component that controls access on a substrate to another semiconductor component to be accessed on the substrate. The capacitor element functions as a short-circuit path to the ground plane for the harmonic component of the enable control signal and makes smaller the through rate and makes larger the timing window of the enable control signal compared to those when the capacitor element is not provided.

16 Claims, 14 Drawing Sheets

ELECTRONIC DEVICE

CROSS-REFERENCE TO RELATED APPLICATIONS

The disclosure of Japanese Patent Application No. 2010-146142 filed on Jun. 28, 2010 including the specification, drawings and abstract is incorporated herein by reference in its entirety.

BACKGROUND

The present invention is involved in improving waveform of an access control signal in an electronic device mounting semiconductor component that is accessed and a semiconductor component that accesses on a substrate having a wiring layer, and relates to technology effective when applied to a processor board, control board, etc., on which DIMM (Dual Inline Memory Module) mounting, for example, DDR3-SDRAM (Double-Data-Rate3 Synchronous Dynamic Random Access Memory) is populated.

To a clock synchronous memory operated in synchronization with a clock signal represented by DDR3-SDRAM, an enable control signal to indicate that a clock signal or a command and address signal supplied thereto is valid is input together with the clock signal and the command and address signal. When the clock signal and the command and address signal are indicated to be valid by the enable control signal, the clock synchronous memory performs an access operation according to a timing sequence by an internal logic in synchronization therewith. A state where read data and write data are settled in the access operation is notified by a data strobe signal.

For example, in a memory module such as DIMM, a plurality of clock synchronous memories is mounted and the clock synchronous memories are operated synchronously in a parallel manner. For the synchronous operation in a parallel manner, Non-Patent Document 1 (JEDEC Standard No. 21C, Revision 1.0 Release 18A, 4. 20. 18-204-Pin DDR3 SDRAM Unbuffered SO-DIMM Design Specification, page 4. 20. 18-01-4. 20. 11-60) describes that the T-branch structure is employed for the wiring on the module substrate for the clock signal and the command and address signal supplied commonly to a plurality of DDR2-SDRAMs mounted on DIMM. Due to the T-branch structure, it is made easy to make the same in length the signal wirings from the module terminal of DIMM to the clock terminal and the command and address terminal of the DDR2-SDRAMs, respectively. On the other hand, Non-Patent Document 2 (JEDEC Standard No. 21C, Revision 2.5 Release 18, 4. 20. 11-200-Pin DDR2 SDRAM Unbuffered SO-DIMM Design Specification, page 4. 20. 11-01-4. 20. 11-66) referring to the standard of DIMM mounting DDR3-SDRAM describes that the wiring structure for the clock signal and the command and address signal on the module substrate employs the fly-by structure instead of the T-branch structure. The fly-by structure is a structure in which external terminals of a plurality of DDR3-SDRAMs are coupled sequentially in the form of a string of beads, to a signal line that can be traced with a single stroke and its purpose is to give priority to coupling of DDR3-SDRAMs with the shortest distance over isometric wiring. This is because when isometric wiring becomes more difficult as the operation speed becomes faster, the number of times of routing in wiring for equalization in length increases and the quality of signal waveform deteriorates as a result. For non-isometric wirings due to the fly-by structure, leveling control is performed to delay the input timing etc. of a data strobe signal according to the propagation delay of a clock signal etc. supplied by the wiring with the fly-by.

SUMMARY

The memory module such as DIMM is widely applied to a main memory of various computer systems and memory interface control, timing control, etc., for SDRAM of a DDR configuration mounted on DIMM are performed by a memory controller according to an access request from a processor core etc. It is desirable for the memory controller to be applicable to control of a plurality of kinds of memory module with different standards, such as DIMM mounting DDR2-SDRAM and DIMM mounting DDR3-SDRAM, according to its operation mode in terms of cost and versatility.

However, the inventors of the present invention have made clear that there is a case where it is not possible to deal with only by the timing control of an output signal such as the leveling control when the properties of the in-module wiring structures in a plurality of kinds of DIMM to be controlled by one memory controller are different essentially. For example, the situations of signal reflection that occurs in the signal line are considerably different between the case where the in-module wiring has the T-branch structure and the case where it has the fly-by structure and it is not quite possible for the leveling control of the data strobe signal to solve all the problems. That is, in the case of the in-module wiring with the fly-by structure, a memory device on the upstream side of an input signal receives noises reflected via the input capacitance component of a memory device on the more downstream side thereof in a superimposed manner and as a result, the waveform of an input signal is more distorted in a memory device nearer to the signal input terminal (memory device on the upstream side of the input signal). Such distortion will affect the high-level period and the low-level period or the signal cycle of the signal and as a result, narrowing the valid period (timing window) as to the timing specified by the signal.

In order to relax such an influence due to signal reflection, it is also possible to deal with it by adjusting the values of the termination resistor and the series resistor in the in-module wiring, however, as the memory operating frequency increases, the harmonic component (high-frequency component) superimposed on the signal waveform increases and there can be supposed a case where the reflected wave is superimposed on the harmonic component and it is not possible to deal with it sufficiently. Further, for DIMM mounting DDR3-SDRAM, a predetermined termination resistor is mounted on a module substrate as described in Non-Patent Document 2, and therefore, it is not possible even to deal with it by mutually adjusting the values of the termination resistor and the series resistor described above.

In order to suppress the harmonic component, it is required to reduce the through rate, that is, the change rate of a signal, however, if the through rate of the output buffer of the memory controller is reduced, there occurs a possibility that the drive performance of DIMM mounting DDR2-SDRAM and employing isometric-wiring is reduced. In contrast to this, if the drive performance of the output buffer is made variable according to the operation mode, the circuit scale of the memory controller increases and the cost is raised as in the case where the memory controller is divided for each structure of DIMM. It is not effective to suppress the harmonic component only by the series resistor inserted into the wiring that couples DIMM and the memory controller.

The present invention has been made in view of the above circumstances and suppresses a timing window by a signal from being narrowed undesirably by the harmonic component of the signal output from a semiconductor component without imposing a burden on the semiconductor component that controls access.

The other purposes and the new feature of the present invention will become clear from the description of the present specification and the accompanying drawings.

The following explains briefly the outline of a typical invention among the inventions disclosed in the present application.

That is, a capacitor element is arranged in series with a specific transmission path branching from a predetermined node of a signal transmission path and reaching to a ground plane, the signal transmission path supplying an enable control signal that indicates the validity of a clock signal and a command and address signal output from a semiconductor component that controls access on a substrate to another semiconductor component to be accessed on the substrate. The capacitor element functions as a short-circuit path to the ground plane for the harmonic component of the enable control signal and makes smaller the through rate and makes larger the timing window of the enable control signal compared to those when the capacitor element is not provided.

The following explains briefly the effect acquired by the typical invention among the inventions disclosed in the present application.

That is, it is possible to suppress a timing window by a signal from being narrowed undesirably by the harmonic component of the signal output from a semiconductor component without imposing a burden on the semiconductor component that controls access.

DETAILED DESCRIPTION

1. Outline of Embodiments

Figure 1:
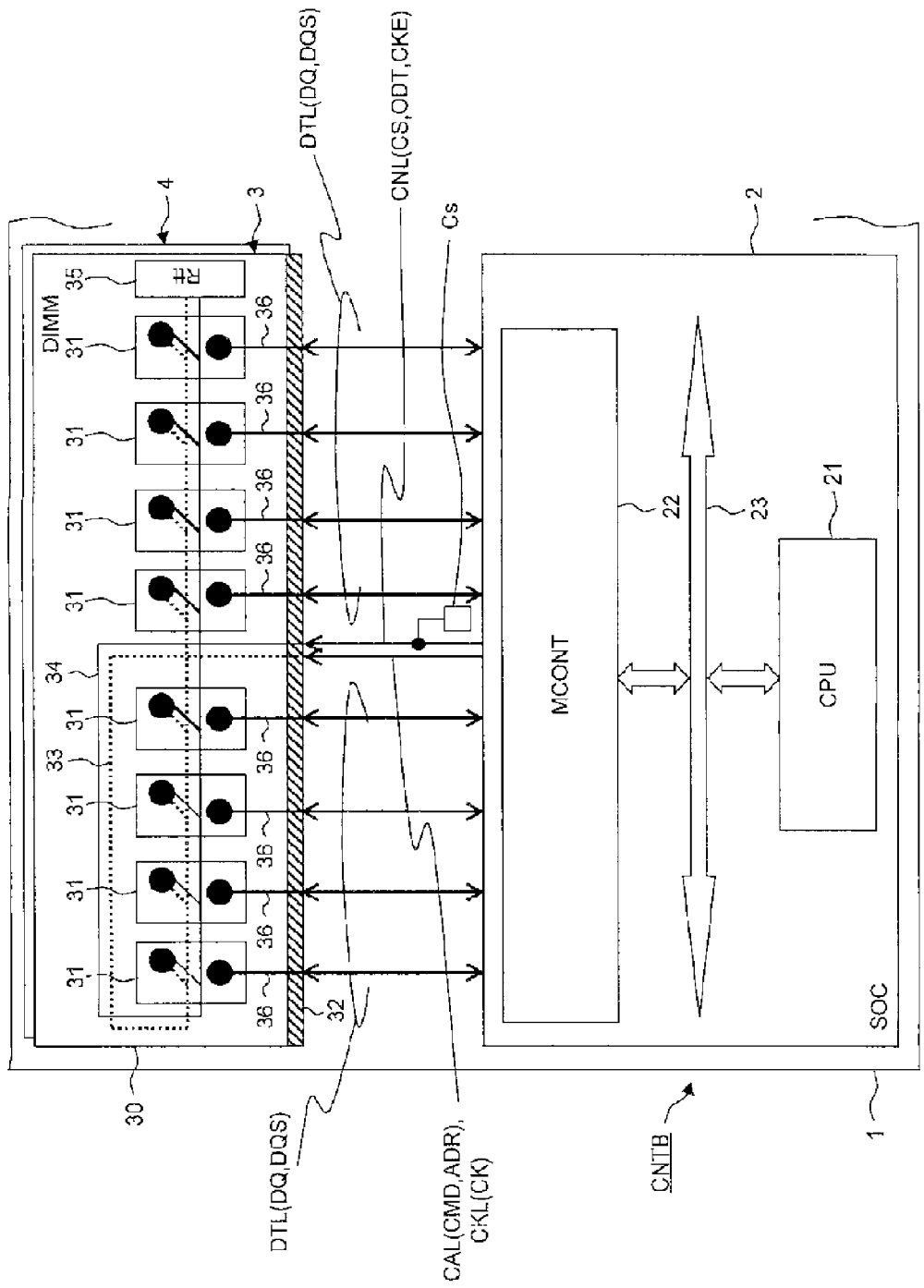
FIG. 1 is a block diagram illustrating a control board mounting DIMM with a fly-by structure including DDR3-SDRAM.

First, the outline of typical embodiments of the present invention disclosed in the present application is explained. In the explanation of the outline of the typical embodiments, reference symbols with brackets attached in the drawings and referred to merely illustrate those included in the concept of components to which the reference symbols are attached.

[1]<Arrangement of Specific Capacitor Between Control System Wiring and Gnd>

An electronic device (CNTB) according to the typical embodiments of the present invention includes a substrate (1) having a plurality of first terminals (12) formed in a first semiconductor component mounting region (2M), a plurality of second terminals (11) formed in a second semiconductor component mounting region (3M, 4M), and transmission paths (CNL) coupling the first terminals (12) and the second terminals (11), respectively, a first semiconductor component (2) mounted in the first semiconductor component mounting region, and a second semiconductor component (3, 4) mounted in the second semiconductor component mounting region. The second semiconductor component has a plurality of memory devices (31) operated in synchronization with a clock signal and the first semiconductor component has a memory controller (22) that controls the second semiconductor component. The transmission paths include a clock transmission path (CKL) to supply the clock signal (CK) from the first semiconductor component to the second semiconductor component, a command/address transmission path (CAL) to supply a command (CMD) and address (ADR) signal from the first semiconductor component to the second semiconductor component, a data system transmission path (DTL) to transmit data between the first semiconductor component and the second semiconductor component, and a first control system transmission path (CNL (CS, CKE)) to transmit a first control system signal (CKE, CS) to indicate the validity of the clock signal and the command and address signal from the first semiconductor component to the second semiconductor component. The substrate further includes a ground plane (L2 (GND)), a first specific transmission path (Vi (Cs)) branching from the middle of the first control system transmission path and reaching the ground plane, and a first capacitor element (Cs (CS), Cs (CKE)) arranged in series with the first specific transmission path. The first capacitor element has a capacitance value greater than a parasitic capacitance of a path from a proximal end (CNL_B) in the direction of signal transmission of the first control system transmission path to the branching point to the first specific transmission path.

The first capacitor element has a capacitance that can be distinguished from that of the parasitic capacitance component in the first control system transmission path and functions as a short-circuit path to the ground plane for the harmonic component superimposed on the first control system signal and makes smaller the through rate and makes larger the timing window of the first control system signal compared to those when the capacitor element is not provided.

The first control system signal is a signal to indicate the validity of the clock signal and the command and address signal because of its properties and as a result of suppression of the quality of a signal waveform of the first control system signal from deteriorating, that is, the timing window from being narrowed, it is possible for the second semiconductor component to start a memory operation by taking in the command and address signal within the clock signal cycle in which the memory controller of the first semiconductor component has activated the first control system signal. In other words, it is possible for the first semiconductor component to settle the memory operation by waiting for the normal latency from the clock cycle in which it has activated the first control system signal.

The signal transmission path of the command and address signal itself does not employ a capacitor element that suppresses the harmonic component. The command and address signal is a signal the validity of which is determined according to the change timing of the first control system signal, and therefore, it is only required that a signal value be settled in units of the clock signal cycles including the change timing and so severe a timing window as that required for the first control system signal is not required. For the command and address signal having such properties, the capacitor element that suppresses the harmonic component is not employed, and therefore, an increase in the circuit scale and a rise in the cost resulting from excessive circuit elements are suppressed.

[2]<Arrangement of First Capacitor Near Memory Controller>

In the electronic device described in the item 1, the distance from the first semiconductor component on the first control system transmission path to the branching point to the first specific transmission path is shorter than the distance from the branching point on the first control system transmission path to the second semiconductor component.

It is possible to reduce the influence of the harmonic component more if the first capacitor element is arranged in a position nearer to the first semiconductor component.

[3]<Fly-by Structure>

In the electronic device described in the item 1, the second semiconductor component is a memory module in which the memory devices (31) are mounted on a module substrate (30) and to a clock wire (33) within the module substrate receiving a clock signal supplied from the clock transmission path, to a signal line (33) within the module substrate receiving a command and address signal supplied from the command/address transmission path, and to a signal line (34) within the module substrate receiving a first control system signal from the first control system transmission path, corresponding terminals of the memory devices are coupled in the fly-by topology.

The reason for the above is that the harmonic component adversely affects more when a memory module having an in-module wiring with the fly-by structure is used than when a memory module having an in-module wiring with the T branch structure is used.

[4]<DDR3>

In the electronic device described in the item 3, the memory device is DDR3-SDRAM. The first control system signal is a chip select signal (CS) and a clock enable signal (CKE) in the DDR3-SDRAM.

It is possible to address a problem caused by the chip select signal and the clock enable signal when employing a memory module that uses DDR3-SDRAM.

[5]<Arrangement of Specific Capacitor Between ODT Wiring and Gnd>

In the electronic device described in the item 1, the transmission paths further include a second control system transmission path CNL (ODT) to transmit a second control system signal (ODT) to selectively switch the transmission characteristics of the data system transmission path from the first semiconductor component to the second semiconductor component. The substrate further has a second specific transmission path (Vi (Cs)) branching from the middle of the second control system transmission path and reaching the ground plane and a second capacitor element (Cs (ODT)) arranged in series at the middle of the second specific transmission path. The second capacitor element has a capacitance value greater than a parasitic capacitance of a path from the proximal end in the direction of signal transmission of the second control system transmission path to the branching point to the second specific transmission path.

The second capacitor element has a capacitance that can be distinguished from that of the parasitic capacitance component in the second control system transmission path and functions as a short-circuit path to the ground plane for the harmonic component superimposed on the second control system signal and makes smaller the through rate and makes larger the timing window of the enable control signal compared to those when the capacitor element is not provided.

The second control system signal is a signal to selectively switch the transmission characteristics of the data system transmission path and as a result of suppression of the quality of a signal waveform of the signal from deteriorating, that is, the timing window from being narrowed, it is possible for the second semiconductor component to switch the transmission characteristics of the data transmission system within the clock signal cycle in which the memory controller of the first semiconductor component has activated the second control system signal.

[6]<Arrangement of Second Capacitor Near Memory Controller>

In the electronic device described in the item 5, the distance from the first semiconductor component on the second control system transmission path to the branching point to the second specific transmission path is shorter than the distance from the branching point on the second control system transmission path to the second semiconductor component.

It is possible to reduce the influence of the harmonic component more if the second capacitor element is arranged in a position nearer to the first semiconductor component.

[7]<Fly-by Structure>

In the electronic device described in the item 5, the second semiconductor component is a memory module in which the memory devices are mounted on a module substrate and to a clock wire within the module substrate receiving a clock signal supplied from the clock transmission path, to a signal line within the module substrate receiving a command and address signal supplied from the command/address transmission path, to a signal line within the module substrate receiving a first control system signal from the first control system transmission path, and to a signal line within the module substrate receiving a second control system signal supplied from the second control system transmission path, corresponding terminals of the memory devices are coupled in the fly-by topology.

The reason for the above is that the harmonic component adversely affects more when a memory module having an in-module wiring with the fly-by structure is used than when a memory module having an in-module wiring with the T branch structure is used.

[8]<DDR3>

In the electronic device described in the item 7, the second semiconductor component is DDR3-SDRAM, the memory device has an on-die termination that can be utilized as a termination resistor corresponding to the data system transmission path, and a select signal input from the input terminal is an on-die termination specifying signal to specify the validity or invalidity of the on-die termination.

It is possible to address a problem caused by the on-die termination specifying signal when employing a memory module that uses DDR3-SDRAM.

[9]<Routing of Control System Transmission Path in Uppermost Layer and Lowermost Layer of Multilayer Wiring Substrate>

In the electronic device described in the item 5, the substrate has a plurality of wiring layers (L1 to L6) and the first control system transmission path and the second control system transmission path are formed in the wiring layers in the uppermost layer (L1) and the lowermost layer (L6), respectively, of the wiring layers and the first terminals and the second terminals are formed in the uppermost layer, respectively, of the wiring layers.

It is advantageous when mounting the first semiconductor component and the second semiconductor component on the substrate.

[10]<Making Common Via Wire Coupling Capacitor Elements to Ground Plane>

In the electronic device described in the item 9, the ground plane is formed in the wiring layer of an interlayer between the uppermost layer and the lowermost layer of the wiring layers. The specific transmission path is electrically coupled to the ground plane, respectively, via a via wire (Vicom) provided in a through hole formed in the substrate. The via wires are each commonly coupled to neighboring wires included in the first control system transmission path and the second control system transmission path in the planar view.

[11]<Arrangement of Specific Capacitor Between Control System Wire with Fly-by Structure and Gnd>

The electronic device according to another embodiment of the present invention is a device in which a first semiconductor component and a second semiconductor component that controls the first semiconductor component are mounted on a substrate and the second semiconductor component has a plurality of memory devices operated in synchronization with a clock signal. The substrate has a plurality of signal paths to couple the second semiconductor component to the first semiconductor component. The signal paths include a clock transmission path to supply the clock signal from the first semiconductor component to the second semiconductor component, a command/address transmission path to supply a command and address signal from the first semiconductor component to the second semiconductor component, a data system transmission path to transmit data between the first semiconductor component and the second semiconductor component, and a first control system transmission path to transmit a first control system signal to indicate the validity of the clock signal and the command and address signal from the first semiconductor component to the second semiconductor component. The substrate further includes a ground plane, a specific transmission path branching from the middle of the first control system transmission path and reaching the ground plane, and capacitor element arranged in series with the specific transmission path. The capacitor element makes smaller the through rate and makes larger the timing window of the first control system signal compared to those when the capacitor element is not provided.

The first capacitor element functions as a short-circuit path to the ground plane for the harmonic component superimposed on the first control system signal and makes smaller the through rate and makes larger the timing window of the first control system signal compared to those when the capacitor element is not provided.

As a result of suppression of the quality of a signal waveform of the first control system signal from deteriorating, that is, the timing window from being narrowed, it is possible for the second semiconductor component to start a memory operation by taking in a command and address signal within the clock signal cycle in which the memory controller of the first semiconductor component has activated the first control system signal. In other words, it is possible for the first semiconductor component to settle the memory operation after waiting for the normal latency from the clock cycle in which it has activated the first control system signal.

The signal transmission path of a command and address signal itself does not employ a capacitor element that suppresses the harmonic component, and therefore, an increase in circuit scale and a rise in cost resulting from excessive circuit elements are suppressed.

[12]<Arrangement of Specific Capacitor Between ODT Wiring and Gnd>

In the electronic device described in the item 11, the transmission paths further include a second control system transmission path to transmit the second control system signal to selectively switch the transmission characteristics of the data system transmission path from the first semiconductor component to the second semiconductor component. The substrate further includes a second specific transmission path branching from the middle of the second control system transmission path and reaching the ground plane and a second capacitor element arranged in series in the middle of the second specific transmission path. The second capacitor element makes smaller the through rate and makes larger the timing window of the second control system signal.

The second capacitor element functions as a short-circuit path to the ground plane for the harmonic component superimposed on the second control system signal and makes smaller the through rate and makes larger the timing window of the enable control signal compared to those when the capacitor element is not provided.

The second control system signal is a signal to selectively switch the transmission characteristics of the data system transmission path and as a result of suppression of quality of a signal waveform of the signal from deteriorating, that is, the timing window from being narrowed, it is possible for the second semiconductor component to switch the transmission characteristics of the data transmission system within the clock signal cycle in which the memory controller of the first semiconductor component has activated the second control system signal.

[13]<Fly-by Structure>

In the electronic device described in the item 12, to a clock wire within the module substrate receiving a clock signal supplied from the clock transmission path, to a signal line within the module substrate receiving a command and address signal supplied from the command/address transmission path, and to a signal line within the module substrate receiving a first control system signal from the first control system transmission path, corresponding terminals of the memory devices are coupled in the fly-by topology.

The reason for the above is that the harmonic component adversely affects more when a memory module having an in-module wire wiring the fly-by structure is used than when a memory module having an in-module wiring with the T branch structure is used.

[14]<Fly-by Structure>

In the electronic device described in the item 13, in the second semiconductor component, to a signal line within the module substrate receiving a second control system signal supplied from the second control system transmission path, corresponding terminals of the memory devices are coupled in the fly-by topology.

The reason for the above is that the harmonic component adversely affects more when a memory module having an in-module wiring with the fly-by structure is used than when a memory module having an in-module wiring with the T branch structure is used.

[15]<DDR3>

In the electronic device described in the item 14, the memory device is DDR3-SDRAM and the first control system signal is a chip select signal and a clock enable signal in DDR3-SDRAM.

It is possible to address a problem caused by the chip select signal and the clock enable signal when employing a memory module using DDR3-SDRAM.

[16]<DDR3>

In the electronic device described in the item 15, the memory device has an on-die termination that can be utilized as a termination resistor corresponding to the data system transmission path and the select signal input from the input terminal is an on-die termination specifying signal to specify the validity or invalidity of the on-die termination.

It is possible to address a problem caused by the on-die termination specifying signal when employing a memory module using DDR3-SDRAM.

2. Detailed Description of the Embodiment

The embodiment is explained in more detail.

<<Control Board Mounting DIMM>>

In FIG. 1, the embodiment of the electronic device according to the present invention is shown in a block diagram. In the diagram, although not limited in particular, the control board mounted on devices, such as a printer and image scanner, and controlling the operation thereof is shown. A control board CNTB shown in the diagram includes a microcomputer (SOC, semiconductor component) 2, a system-on-chip, to realize a control function according to a device to be controlled, DIMM (semiconductor component) 3, 4 as a memory module used in the work region of the microcomputer 2, etc., mounted on a wiring board 1. It is needless to say that the wiring board 1 may include other semiconductor components, although not shown schematically. The microcomputer 2 is an example of the first semiconductor component and DIMM 3, 4 is an example of the second semiconductor component.

Although not limited in particular, the microcomputer 2 includes a memory controller (MCONT) 22, a peripheral circuit module, not shown schematically, etc., together with a central processing unit (CPU) 21 coupled to an internal bus 23 and the CPU 21 controls devices by executing commands according to the program. Although not limited in particular, the memory controller 22 comprises a memory interface control function for DDR3-SDRAM and DDR2-SDRAM. Here, it is assumed that DIMM 3, 4 includes DDR3-SDRAM mounted thereon. When an object of access by the CPU 21 is DIMM 3, 4, the memory controller 22 controls DIMM 3, 4 by generating an interface signal at a timing necessary to access DDR3-SDRAM of DIMM 3, 4 according to an access address supplied from the internal bus 23.

The microcomputer 2 and DIMM 3, 4 are coupled by a transmission path including a wire etc. over the wiring board 1. The transmission path includes a clock transmission path CKL to supply a clock signal CK from the microcomputer 1 to DIMM 3, 4, a command/address transmission path CAL to supply a command CMD and address signal ADR from the microcomputer 2 to DIMM 3, 4, a data system transmission path DTL to transmit data DQ, a data strobe signal DQS, etc., between the microcomputer 2 and DIMM 3, 4, and a control system transmission path CNL to supply a chip select signal CS, a clock enable signal CKE, and an on-die termination signal ODT as a control signal from the microcomputer 2 to DIMM 3, 4. Here, the clock signal CK is a differential clock signal. The clock signal CK specifying a command according to a combination of levels of strobe signals, such as a row address strobe signal (RAS), column address strobe signal (CAS), and write enable signal (WE) is made significant by assertion of the clock enable signal CKE and DDR3-SDRAM is made possible to read and write data to outside in synchronization with timings of the rise and fall of the clock signal CK, respectively. Inputting a command to DDR3-SDRAM is effective when the chip select signal (CS) is at the enable level and a command is specified by a combination of levels of signals RAS, CAS, and WE etc. Commands include an active command (ACT) in the row address system, a read command (RD) and a write command (WR) as a column address system command, etc. The active command is a command to make active a row address system by specifying a row address. The read command is a command to cause a column system to perform a read operation by specifying a column address after the row address system is made active. The write command is a command to cause a column system to perform a write operation by specifying a column address after the row address system is made active. The column system operation specified by the write command and read command is a burst access operation and with the address specified by the column address as a starting point, data corresponding to the number of bursts is read or written continuously. DDR3-SDRAM is based on eight as the number of bursts. It is necessary for the operation of the column system circuit to reach a predetermined state until the first read data is settled by the column system operation specified by the write command and read command or until it is made possible to input write data first. Such a delay time in the read operation is referred to as read latency and such a delay time in the write operation is referred to as write latency and they are determined as a time corresponding to a plurality of periods of the clock signal CK according to the circuit configuration. The on-die termination signal ODT is a signal to specify whether or not the termination resistor arranged at the termination of the data system wiring incorporated in DDR3-SDRAM is made valid and made significant only for the in-chip wiring of the data system signal, such as DQ and DQS.

The chip select signal CS is an example of the first control system signal to indicate the validity of a command and address signal, the clock enable signal CKE is an example of the first control system signal to indicate the validity of a clock signal, and the on-die termination signal ODT is an example of the second control system signal to selectively switch the transmission characteristics of the data system transmission path.

The configuration of DIMM 3, 4 mounting DDR3-SDRAM is configured in conformity with the specifications shown in Non-Patent Document 2. For example, DIMM 3 the details of which are shown representatively has a plurality of DDR3-SDRAMs 31 mounted on a module substrate 30 on which in-module wirings are formed, on one long side of the module substrate 30, a module interface terminal column 32 is formed and DIMM 3 is coupled to an attachment connector of the wiring board 1 via the module interface terminal column 32. As is also obvious from the description in Non-Patent Document 2 described above, in DIMM 3, 4, part of the in-module wirings coupling the module interface terminal column 32 and the corresponding terminals of DDR3-SDRAM 31 employ the fly-by structure. That is, each of in-module wirings 33 of the clock signal CK, the command CMD, and the address signal ADR and each of in-module wirings 34 of the control signals CS, CKE, ODT employ a structure in which to a signal line that can be traced with a single stroke, the external terminals corresponding to the DDR3-SDRAMs 31 are coupled in the form of a string of beads. Further, to the signal lines of the in-module wirings 33, 34 respectively, a termination resistor (Rtt) 35 provided in advance on the module substrate 30 is coupled. In FIG. 1, one of the in-module wirings 33, one of the in-module wirings 34, and one of the termination resistors 35 are each shown representatively for the sake of convenience, however, in actuality, they are provided for each signal. An in-module wiring 36 corresponding to the data DQ and the data strobe signal DQS is individualized for each signal.

Figure 2:
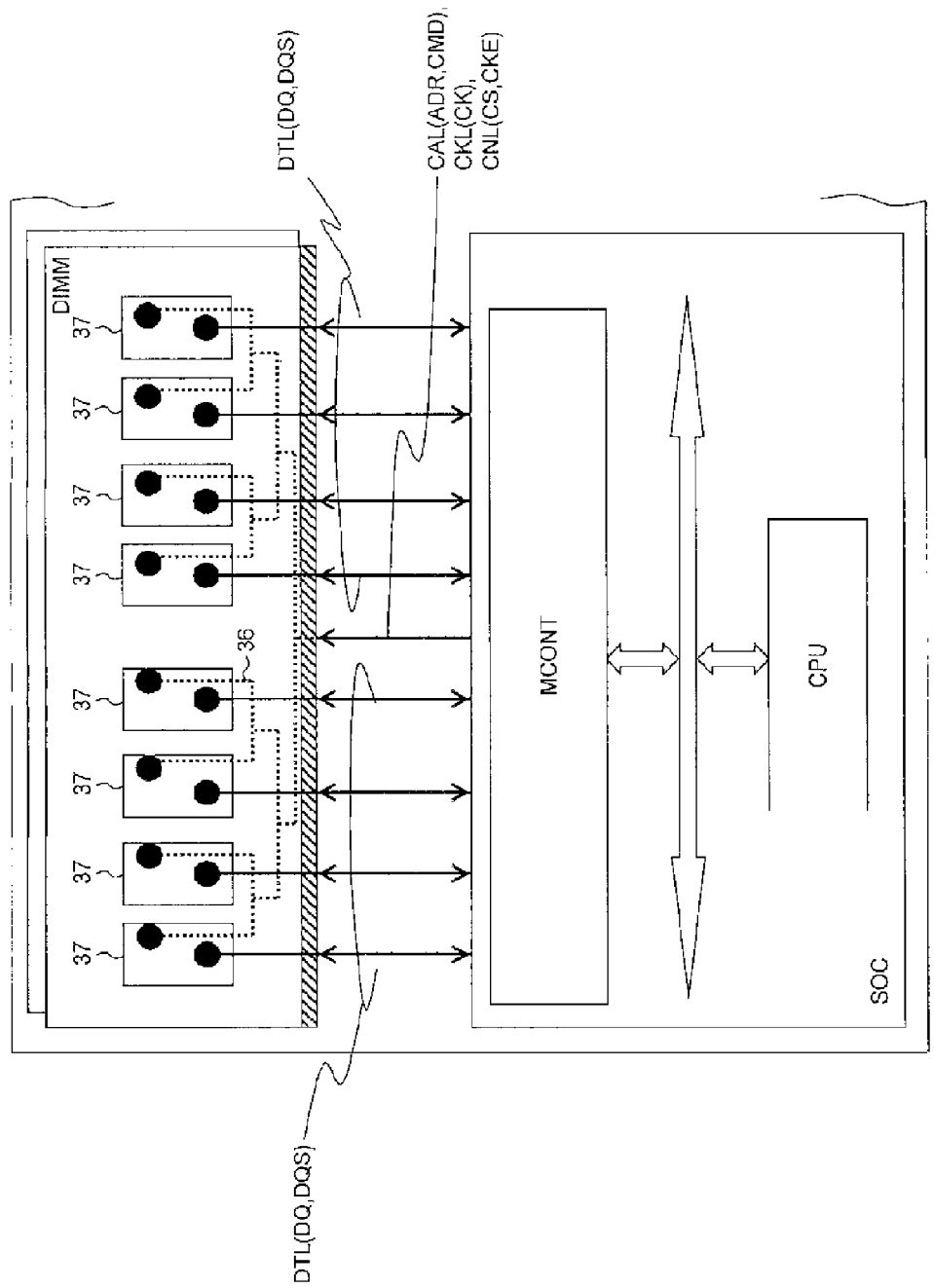
FIG. 2 is a block diagram showing as a comparative example a control board mounting DIMM with a T-branch structure including DDR2-SDRAM.

Instead of the fly-by structure employed in the in-module wirings 33, 34 of DIMM 3, 4, each of the in-module wirings 36 of the clock signal CK, the command CMD, the address signal ADR, and the control signals CS, CKE of the in-module wirings of DIMM mounting DDR2-SDRAM 37 employs the T-branch structure for the purpose of isometric wiring as shown in the comparative example in FIG. 2.

In DIMM 3, 4, the in-module wirings 33, 34 are reduced in length due to the fly-by structure and there is no possibility that the quality of waveform of a signal deteriorates when the number of times of routing in wiring increases on the contrary by forcefully performing isometric wiring as in the case where the T-branch structure is employed. For non-isometric wiring in DIMM 3, 4, the leveling control is performed in which the input timing of the data strobe signal DQS etc. is delayed in accordance with the propagation delay of the clock signal CK etc. In the in-module wirings 33, 34 employing the fly-by structure, which are not objects of the leveling control, DDR3-SDRAM on the upstream side of the input signal receives noise reflected via the input capacitor component of DDR3-SDRAM on the downstream side thereof in a superimposing manner and as a result of this, the waveform of the input signal nearer to the upstream of the signal path is distorted more. In order to relax such distortion and prevent the timing window from being narrowed undesirably, in each signal line of the chip select signal CS, the clock enable signal CKE, and the on-die termination signal ODT of the control system transmission path CNL, the capacitor element Cs is arranged in series between the wiring board 1 and the ground pattern.

<<Working of Waveform Improvement by Cs>>

The working of waveform improvement by the capacitor element Cs is explained using simulation waveforms etc.

Figure 3:
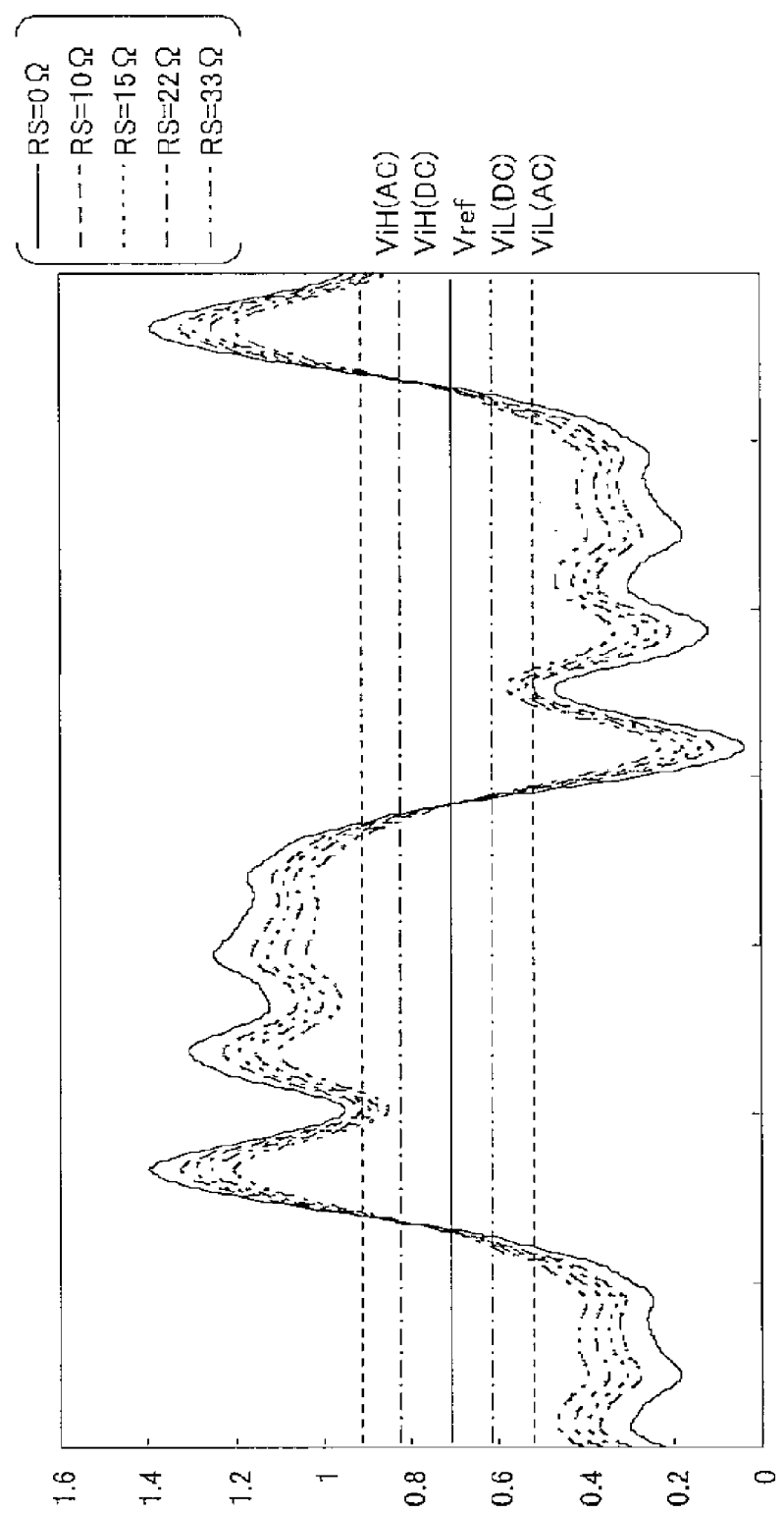
FIG. 3 is a waveform diagram illustrating simulation waveforms according to a comparative example when a capacitor element Cs is not employed, and more particularly, a waveform diagram illustrating simulation waveforms of a pulse signal in the vicinity of DDR3-SDRAM on the most downstream (position nearest to the termination resister) of an in-module wiring.
Figure 4:
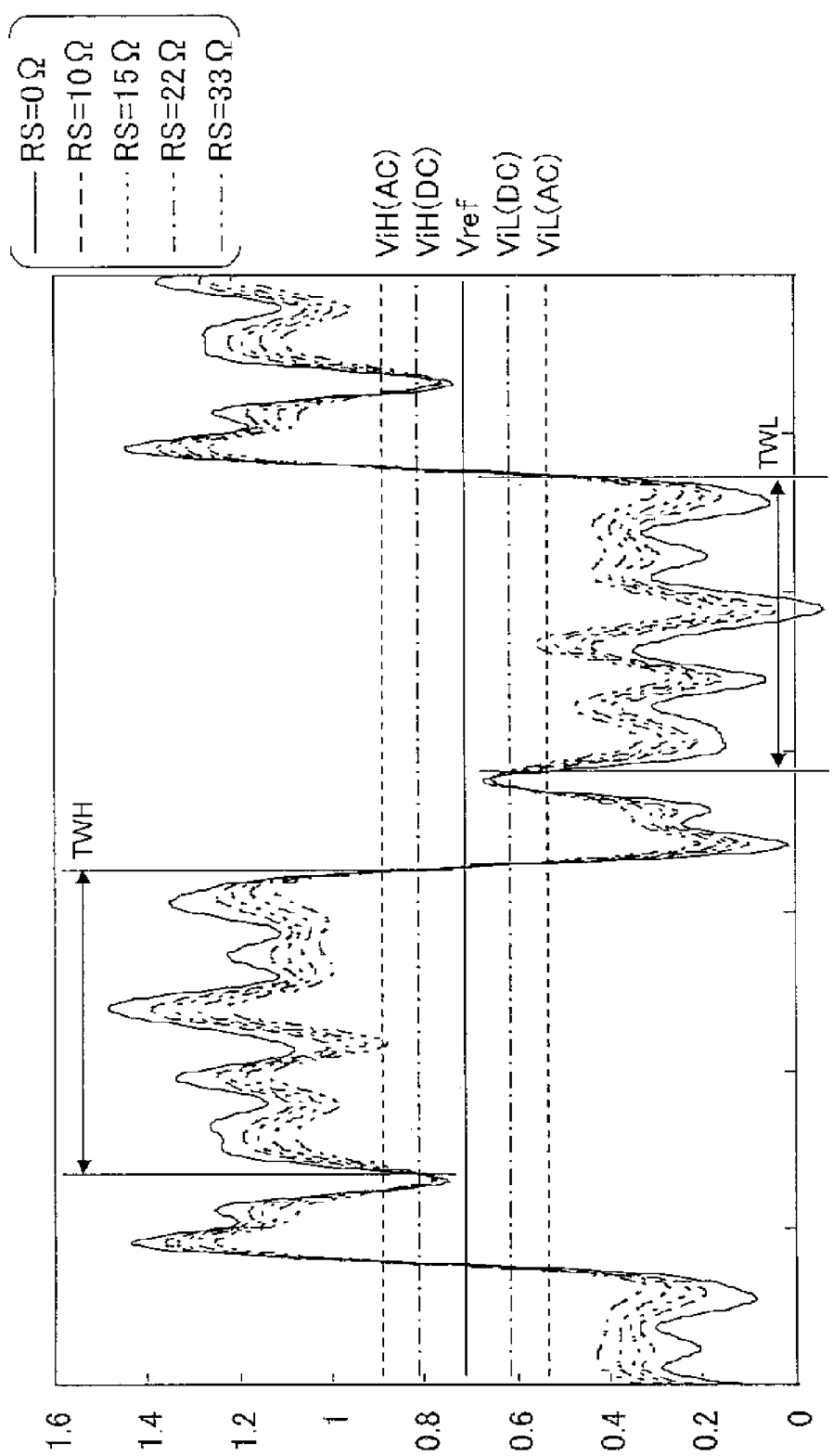
FIG. 4 is a waveform diagram illustrating simulation waveforms according to a comparative example when the capacitor element Cs is not employed, and more particularly, a waveform diagram illustrating simulation waveforms of a pulse signal in the vicinity of DDR3-SDRAM on the most upstream (position farthest from the termination resister) of an in-module wiring.

FIG. 3 and FIG. 4 show simulation waveforms according to a comparative example when the capacitor element Cs is not employed. FIG. 3 illustrates simulation waveforms of a pulse signal in the vicinity of DDR3-SDRAM on the most downstream (position nearest to the termination resistor 35) of the in-module wirings 33, 34 and FIG. 4 illustrates simulation waveforms of a pulse signal in the vicinity of DDR3-SDRAM on the most upstream (position farthest from the termination resistor 35) of the in-module wirings 33, 34. Each simulation waveform corresponds to that when the value of a corresponding series resistor (SR) on the substrate 1 is adjusted between $0\Omega$ and $33\Omega$. It is desirable to adjust the values of the termination resistor of the transmission line and the series resistor to relax the influence by the signal reflection of the transmission line, however, the values of the termination resistor of DIMM 3, 4 is determined in advance by the module substrate 30, and therefore, is not an object to be adjusted and it is difficult to achieve excellent improvement in waveform by adjusting only the value of the series resistor SR. Further, as the memory operation frequency (frequency of the clock signal CK) becomes higher, the number of harmonic components (high-frequency components) superimposed on the signal waveform increases and the reflected wave is superimposed on the harmonic components, making more difficult the improvement in waveform. In particular, the in-module wirings 33, 34 employ the fly-by structure, and therefore, the distortion of the input waveform to DDR3-SDRAM the farthest from the termination resistor 35 becomes the largest as shown in FIG. 4 and immediately after the rise of the signal waveform at the high level, a period occurs during which the level of the signal waveform becomes lower than a threshold voltage ViH (DC) of the high level and immediately after the fall of the signal waveform at the low level, a period occurs during which the level of the input waveform becomes higher than a threshold voltage ViL (DC) of the low level and a timing window TWH at the high level and a timing window TWL at the low level are narrowed.

Figure 5:
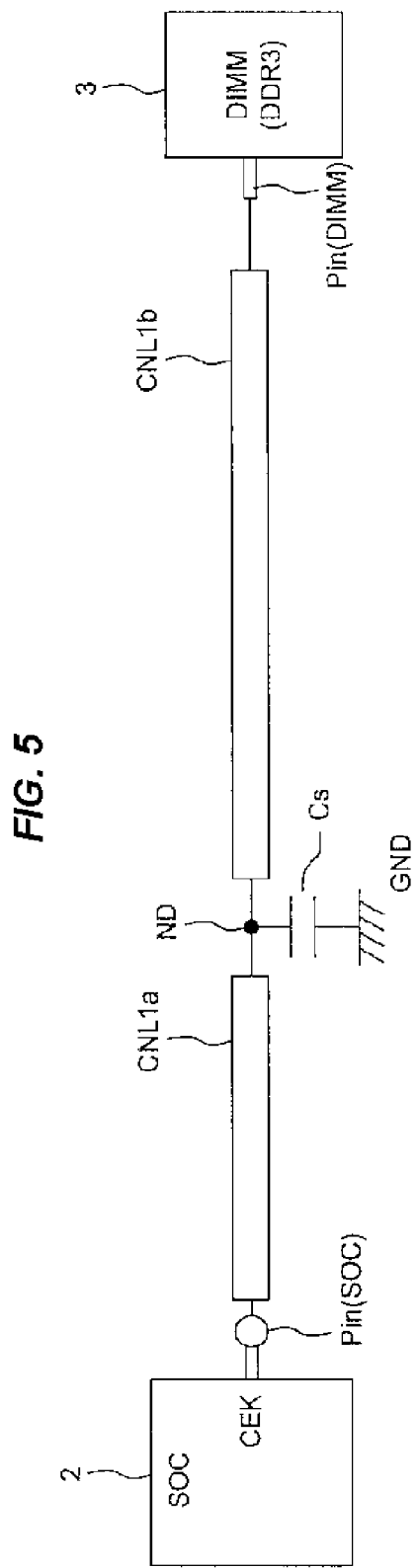
FIG. 5 is a circuit diagram schematically showing a coupling state of the capacitor element Cs for a signal line of a control system transmission path CNL.

FIG. 5 illustrates a coupling state of the capacitor element Cs to the signal line of the control system transmission path CNL in a schematic circuit diagram. Here, a signal line CNL1 of the clock enable signal CKE is shown representatively. The signal line CNL1 is shown schematically divided into parts of CNL1a and CNL1b. Pin (SOC) denotes an output terminal of the clock enable signal CKE in the microcomputer 1 and Pin (DIMM) denotes an input terminal of the clock enable signal CKE in DIMM3. One end of the capacitor element Cs is coupled to a coupling point ND of CNL1a and CNL1b and the other end of the capacitor element Cs is coupled to the ground plane of the circuit substrate, that is, a ground voltage GND. The wiring path length from the output terminal Pin (SOC) to the coupling point ND is shorter than that from the coupling point ND to the input terminal Pin (DIMM) and the coupling point DN is set as near to the input terminal Pin (SOC) as possible.

The capacitor element Cs functions as a short-circuit path for the harmonic component, that is, the high-frequency component output superimposed on the clock enable signal CKE and functions as an open path for components having lower frequencies, and therefore, the harmonic component is suppressed from the clock enable signal CKE exceeding the coupling node ND and reaching the signal wire CNL1b. As a result, the signal waveform in the vicinity of the input terminal of the clock enable signal CKE of DDR3-SDRAM located on the most upstream of the in-module wiring of DIMM3 is less affected by the harmonic component described above even if it is affected, by the reflected wave from the input capacitance of DDR3-SDRAM on the downstream thereof. As a result, the distortion of the signal waveform by the influence of the signal reflection is reduced. The nearer to the output terminal Pin (SOC) the capacitor element Cs is located, the less the contribution of the harmonic component to the signal reflection can be made.

Figure 6:
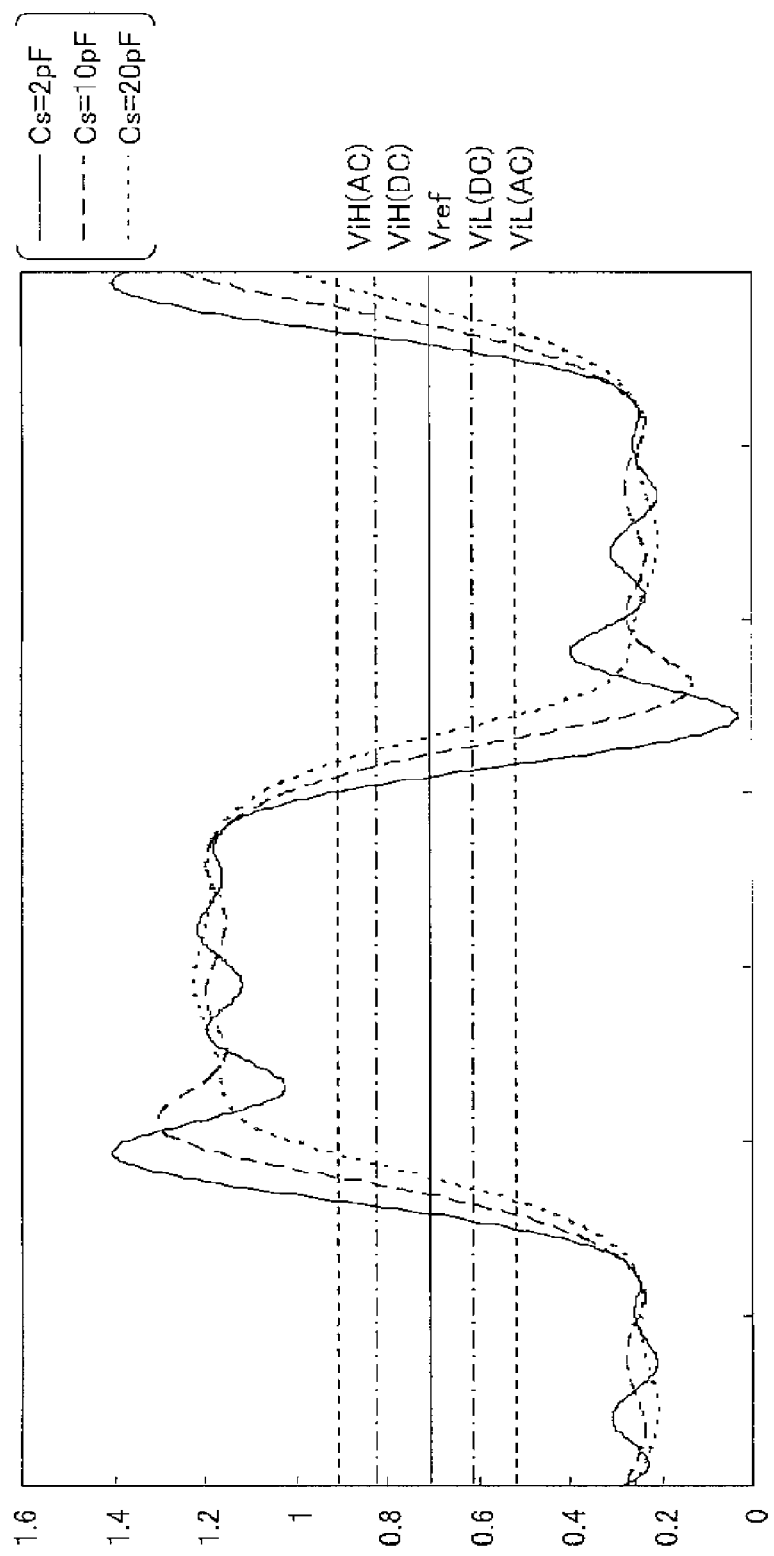
FIG. 6 is a waveform diagram illustrating simulation waveforms when the capacitor element Cs is employed, and more particularly, a waveform diagram illustrating simulation waveforms of a pulse signal in the vicinity of DDR3-SDRAM on the most downstream (position nearest to the termination resister) of an in-module wiring.
Figure 7:
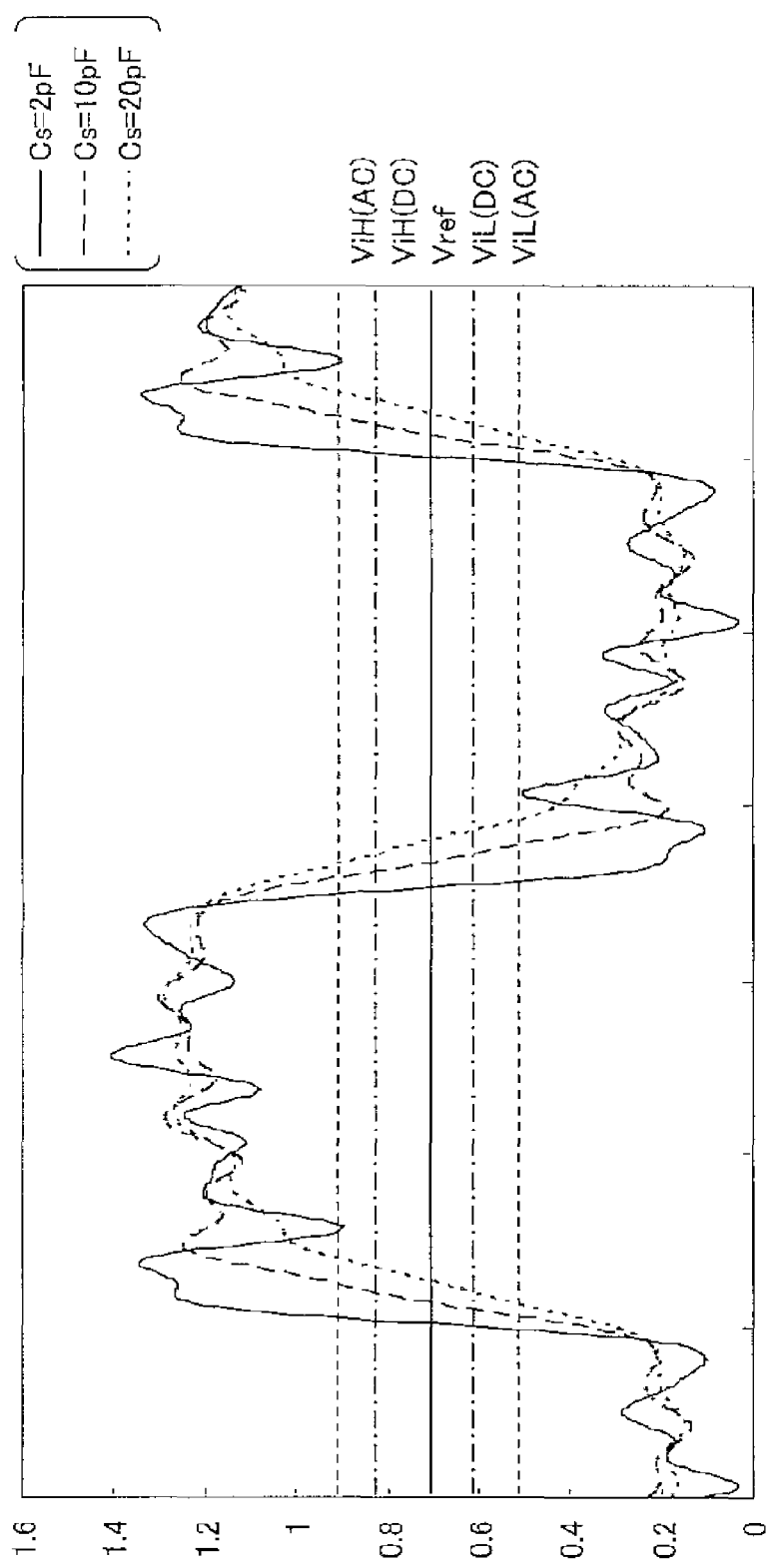
FIG. 7 is a waveform diagram illustrating simulation waveforms when the capacitor element Cs is employed, and more particularly, a waveform diagram illustrating simulation waveforms of a pulse signal in the vicinity of DDR3-SDRAM on the most upstream (position farthest from the terminal resister) of an in-module wiring.

FIG. 6 and FIG. 7 show simulation waveforms when the capacitor element Cs is employed. FIG. 6 illustrates simulation waveforms of a pulse signal in the vicinity of DDR3-SDRAM on the most downstream (position nearest to the termination resistor 35) of the in-module wirings 33, 34 and FIG. 7 illustrates simulation waveforms of a pulse signal in the vicinity of DDR3-SDRAM on the most upstream (position farthest from the termination resistor 35) of the in-module wirings 33, 34. Each of FIG. 6 and FIG. 7 shows simulation waveforms when the value of the corresponding capacitor element Cs is set to 2 pF, 10 pF, 20 pF on the substrate 1. In each of FIG. 6 and FIG. 7, the most excellent waveform improvement effect can be obtained when the capacitance value of the capacitor element Cs is 10 pF. When the capacitance value of the capacitor element Cs is 20 pF, the dullness of the waveform becomes too much. As is obvious from the simulation waveforms in FIGS. 6, 7, the capacitor element Cs acts so as to suppress the harmonic component superimposed on the pulse-shaped signal having a high frequency in the vicinity of the upstream of the transmission path and to make smaller the through rate of the pulse-shaped signal. If the through rate is reduced too small, the timing window is also reduced on the contrary, and therefore, there exists an optimum value that maximizes the timing window with a specific value such as a capacitance value of 10 pF of the capacitor element Cs. However, specific values differ depending on the transmission conditions and for example, it can be thought preferable to determine the value in a range between twice the input capacitance of the external input terminal of DDR3-SDRM, that is, 1.5 pF, and 20 times that. If the capacitor element Cs is specified functionally, the capacitor element Cs functions to make smaller the through rate and make larger the timing window of the control system signal, such as the clock enable signal CKE, compared to those when the capacitor element Cs is not provided. Further, the capacitor element Cs is specified as a capacitance value greater than the parasitic capacitance of the wiring from the terminal Pin (SOC) to the node ND. The working to relax the through rate of a signal can be achieved by using a resistor element, however, when the value of the termination resistor is fixed, as in DDR3-DiMM, the amplitude is reduced and the working to absorb the harmonic component when the capacitor element Cs is used cannot be expected and therefore the DRAM specifications are not met. On the first thought, employing the capacitor element Cs may bring about such an apprehension that the signal reflection is adversely affected as well as the input capacitance of the device, however, the effect of suppression of the signal waveform distortion obtained by absorbing the harmonic component is more advantageous in terms of excellent access control for DDR3-SDRM.

Although not shown schematically in particular, the above applies to the capacitor element Cs of each signal line of the chip select signal CS and the on-die termination signal ODT of the control system transmission path CNL, and therefore, its detailed explanation is omitted.

Because of their properties, the clock enable signal CKE and the chip select signal CS of the control system transmission path CNL are signals to indicate the validity of the clock signal and the command and address signal and as a result of that the quality of the signal waveform of the clock enable signal CKE and the chip select signal CS is suppressed from deteriorating, that is, the timing window is suppressed from being narrowed by employing the capacitor element Cs, it is possible for DIMM3, 4 to take in the command and address signal and start the memory operation in the clock signal cycle in which the memory controller 22 of the microcomputer 2 has activated the clock enable signal CKE and the chip select signal CS. In other words, it is possible for the microcomputer 2 to settle the memory operation by waiting for the normal latency from the clock cycle in which the microcomputer 2 has activated the clock enable signal CKE and the chip select signal CS.

For the control system transmission path CNL of the on-die termination signal ODT, which is a signal to selectively switch the transmission characteristics of the data system transmission path by the on-die termination mounted on the chip of DDR3-SDSRAM, it is also possible to suppress the timing window of the signal waveform of the on-die termination signal ODT from being narrowed by providing the capacitor element Cs as described above, and therefore, it is possible for DIMM3, 4 to switch the transmission characteristics of the data system transmission system within the clock signal cycle in which the memory controller 22 of the microcomputer 2 has activated the on-die termination signal ODT. When it is not possible to switch the transmission characteristics of the data system transmission system within the clock signal cycle, there is possibility that the influence of undesired signal reflection becomes strong in the data system signal wire in the cycle in which switching is delayed accordingly.

For the in-module wiring 33 coupled to the command/address transmission path CAL, the fly-by structure is also employed, and therefore, the timing window is narrowed by the harmonic as in the explanation of FIG. 4 etc. However, for the reasons described below, the capacitor element Cs is not provided in the command/address transmission path CAL.

Firstly, the command and address signal is a signal the validity of which is determined according to the change timing of the chip select signal CS, which is one of the control system signals, and therefore, it will suffice if the signal value is settled in units of the clock signal cycles including its change timing and so severe a timing window as that required for the signal control system signal, such as the chip select signal, is not required. For the command and address signal having such properties, the capacitor element Cs to suppress the harmonic component is not employed, and therefore, it is possible to suppress to a minimum an increase in circuit scale and a rise in cost resulting from the capacitor element Cs.

Figure 8:
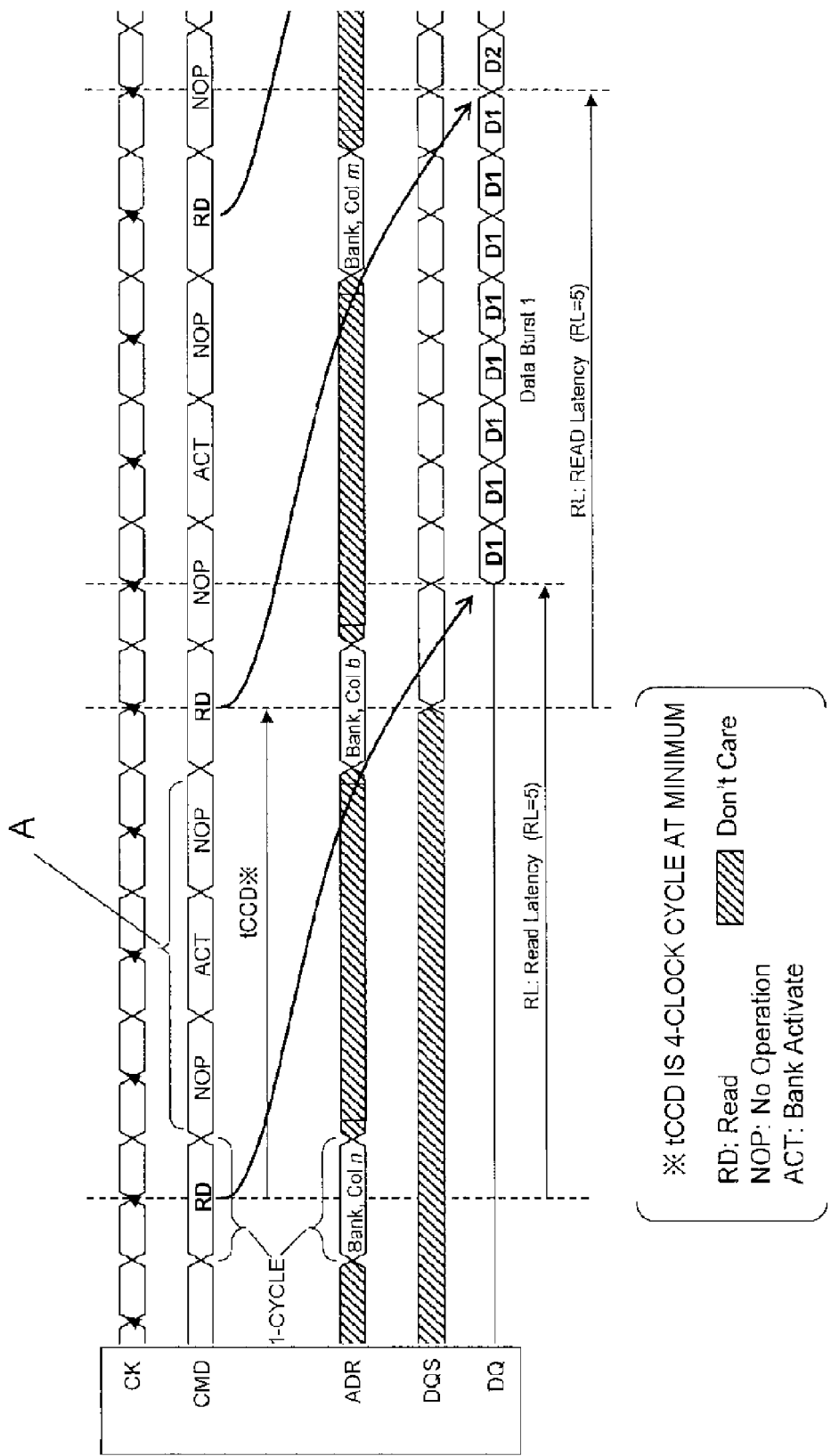
FIG. 8 is a timing chart illustrating a read operation timing when the valid period of a command and address signal is set to one cycle of a clock signal.
Figure 9:
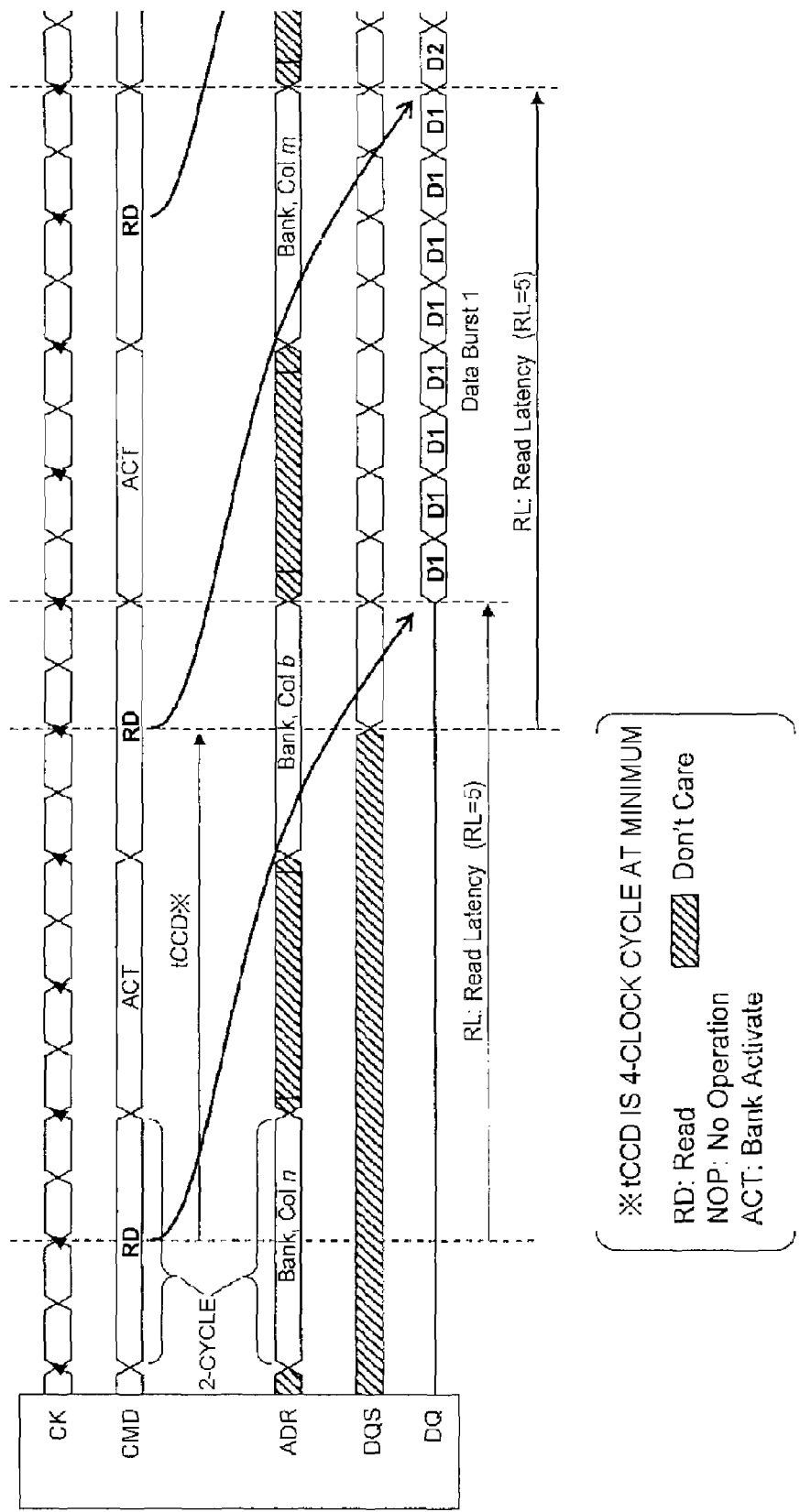
FIG. 9 is a timing chart illustrating a read operation timing when the valid period of a command and address signal is set to two cycles of a clock signal.
Figure 10:
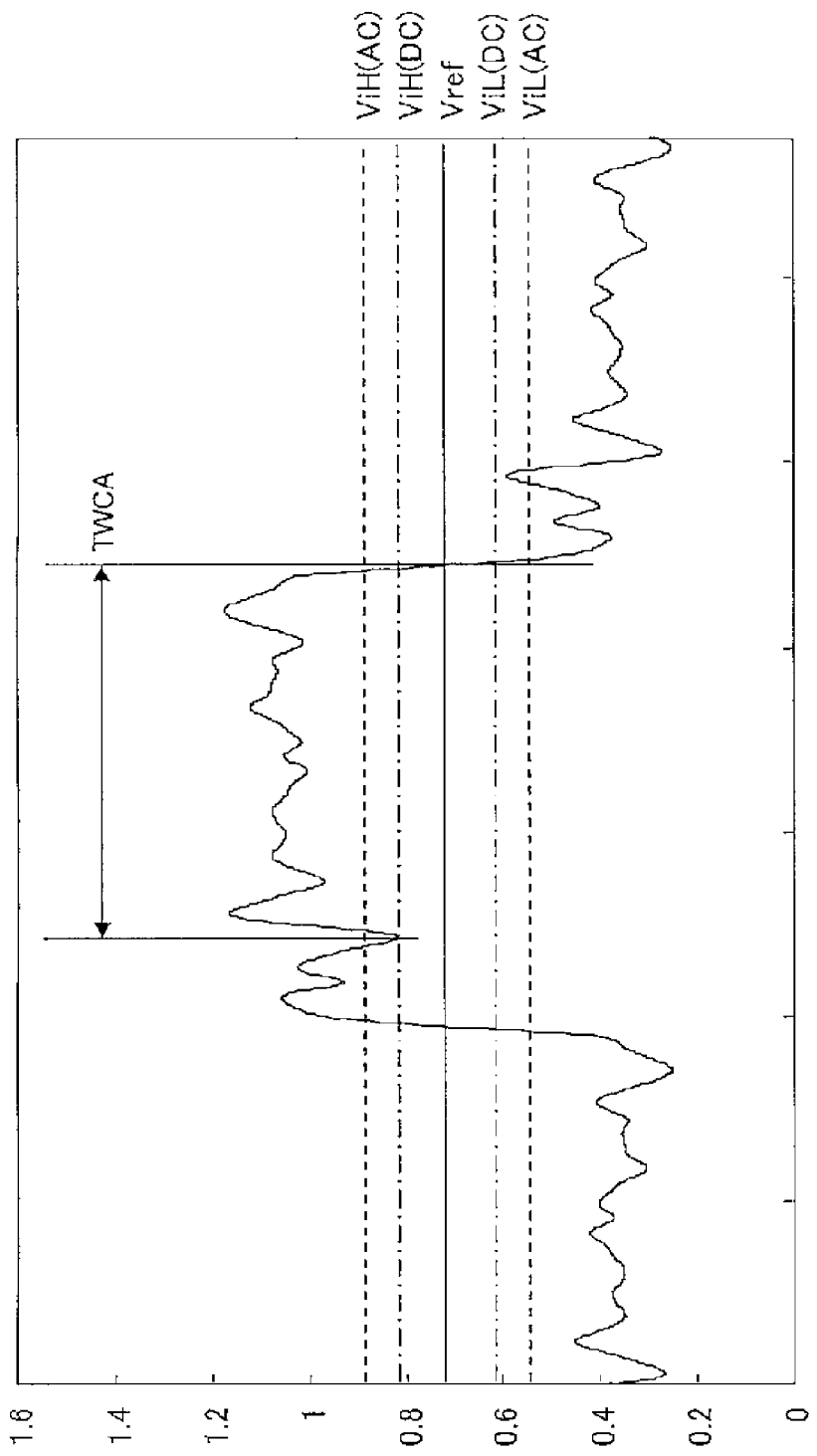
FIG. 10 is a waveform diagram illustrating a waveform when a timing window of a command and address signal is narrowed.

Secondly, because of the standard of DDR3-SDSRAM, it is possible to extend the valid cycle of the command and address signal into two cycles of the clock signal, and therefore, by doing so, substantial trouble will not arise even if the timing window of the signal is narrowed somewhat. That is, the control signal (access strobe signal) represented by the chip select signal CS is controlled to the enable level in the same time as the cycle time of the clock signal CK and it is allowed to change the command and address signal made valid during the low level period of the chip select signal CS in units of two cycles of the clock signal. For example, FIG. 8 illustrates the read operation timing when the valid period of the command and address signal is set to one cycle of the clock cycle (1-clock cycle) and FIG. 9 illustrates the read operation timing when the valid period of the command and address signal is set to two cycles of the clock signal (2-clock cycle). In each case, it is assumed that read latency (RL) is a 5-clock cycle and the interval between the column system commands needs to be a space corresponding to a 3-clock cycle at the minimum. In FIG. 8, if it is assumed that the valid period of the address and command signal is set to a 1-clock cycle, the interval between the column system commands will be a space corresponding to a 3-clock cycle at the minimum as shown by a part A. If the space of the 3-clock cycle is focused on, as shown in FIG. 9, even if the valid period of the command and address signal is set to a 2-clock cycle, the data rate and the timing of the read operation are the same as those in FIG. 8. Consequently, as illustrated in FIG. 10, substantial trouble will not arise even if the timing window of the command and address signal is narrowed as TWCA. Although not shown schematically, the above also applies to the case of write.

<<Layout Configuration of Cs>>

Figure 11:
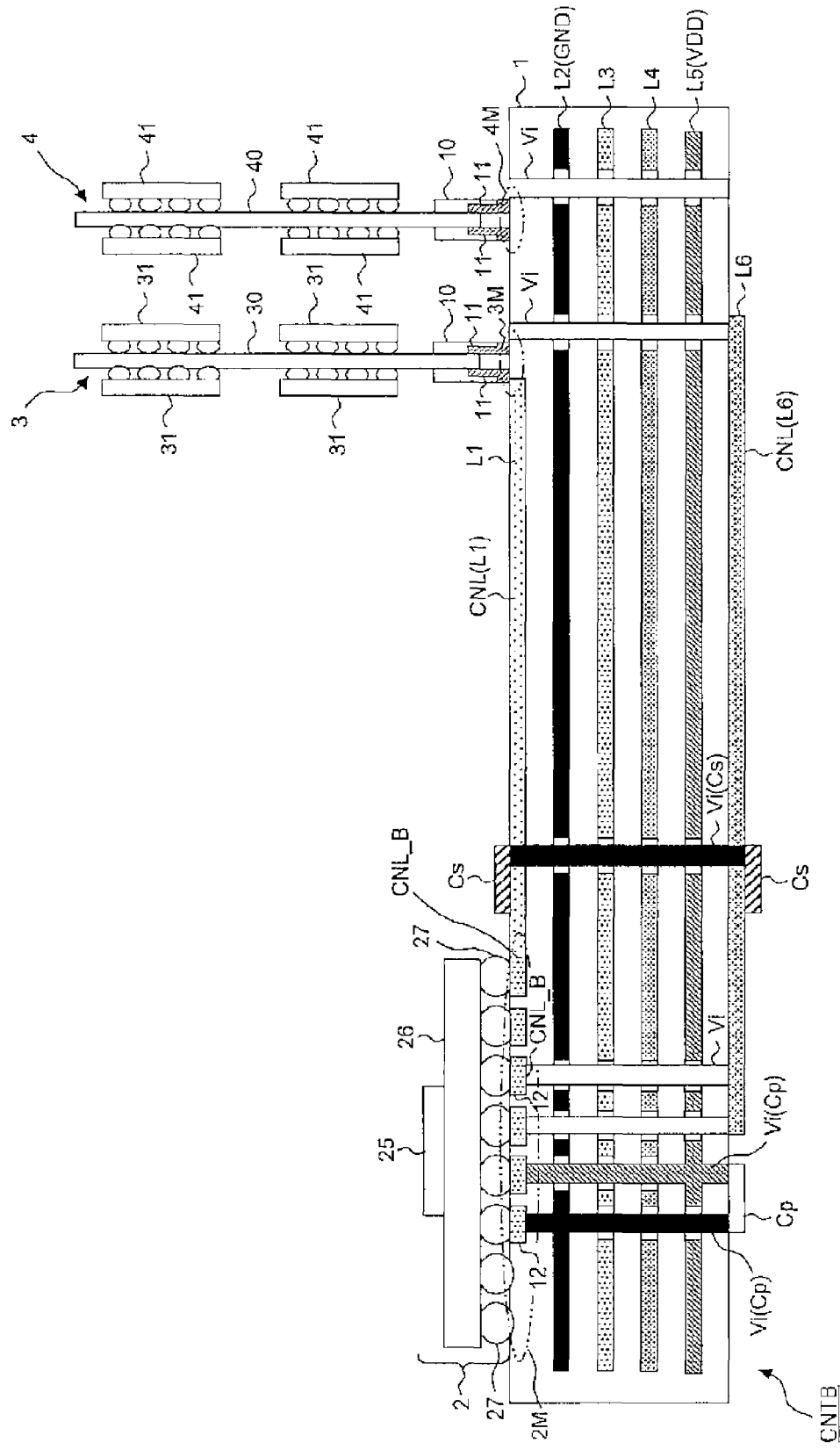
FIG. 11 is a longitudinal section view showing in detail a longitudinal section structure of the control board in FIG. 1.

FIG. 11 shows a longitudinal section structure of the control board in FIG. 1 in detail.

Although not limited in particular, in the wiring board 1 of the control board CNTB, wiring layers L1 to L6 in six layers are formed insulated from one another on a glass epoxy resin substrate and electrical coupling of the wiring layers L1 to L6 is performed by providing a through hole in the direction from the surface to the back surface of the wiring board 1 and coupling a via wire Vi, which is the through hole filled with metal, to a wire in the wiring layer, which is an object of electrically conductive coupling. In the wiring layer L2, a ground plane to which the ground potential GND of the circuit is given is formed and in the wiring layer L5, a power source plane to which a power source voltage VDD is given is formed. In the wiring layers L1, L3, L4, L6, a desired signal wire, power source wire, ground wire, etc., are formed.

The above-described DIMM3, 4 is mounted on a memory module connector 10 so as to be capable of being attached and detached and the terminal of the module interface terminal column of the DIMM3, 4 is caused to come into contact with the corresponding terminal of the memory module connector 10 and coupled to the signal wire, power source wire, and ground wire of the wiring layers L1, K4, L6.

The microcomputer 2 includes a package 26 having a solder bump electrode 27 for packaging at the bottom thereof and a microcomputer chip 25 mounting an electrode pad (not shown schematically) on the surface of the package 26. On the package 26, a package wire coupling the solder bump electrode 27 to a corresponding electrode pad is formed. The solder bump 27 of the microcomputer 2 is mounted over, coupled, to and fixed on a corresponding electrode pad 12 formed in the wiring layer L1. Cp denotes a bypass capacitor to stabilize the power source and in an example, the bypass capacitor is arranged on the back surface of the circuit substrate 1 and coupled to the microcomputer 1 via a via wire Vi (Cp). 2M conceptually denotes a mount region of the microcomputer 2, 3M conceptually denotes a mount region of DIMM3, and 4M conceptually denotes a mount region of DIMM4.

FIG. 11 illustrates control wires CNL (L1), CNL (L6) as a wire of the control system transmission path CNL. The control wire CNL (L1) is formed in the wiring layer L1 and the control wire CNL (L6) is formed in the wiring layer L6. To positions of the control wires CNL (L1), CNL (L6) nearer to the microcomputer 2, one capacitive electrode of both the capacitor elements Cs is coupled, respectively, the other capacitive electrode of both the capacitor elements Cs is coupled to the common via wire Vi (Cs), and the via wire Vi (Cs) is coupled to a ground plane L2 (GND) of the wiring layer.

Figure 12:
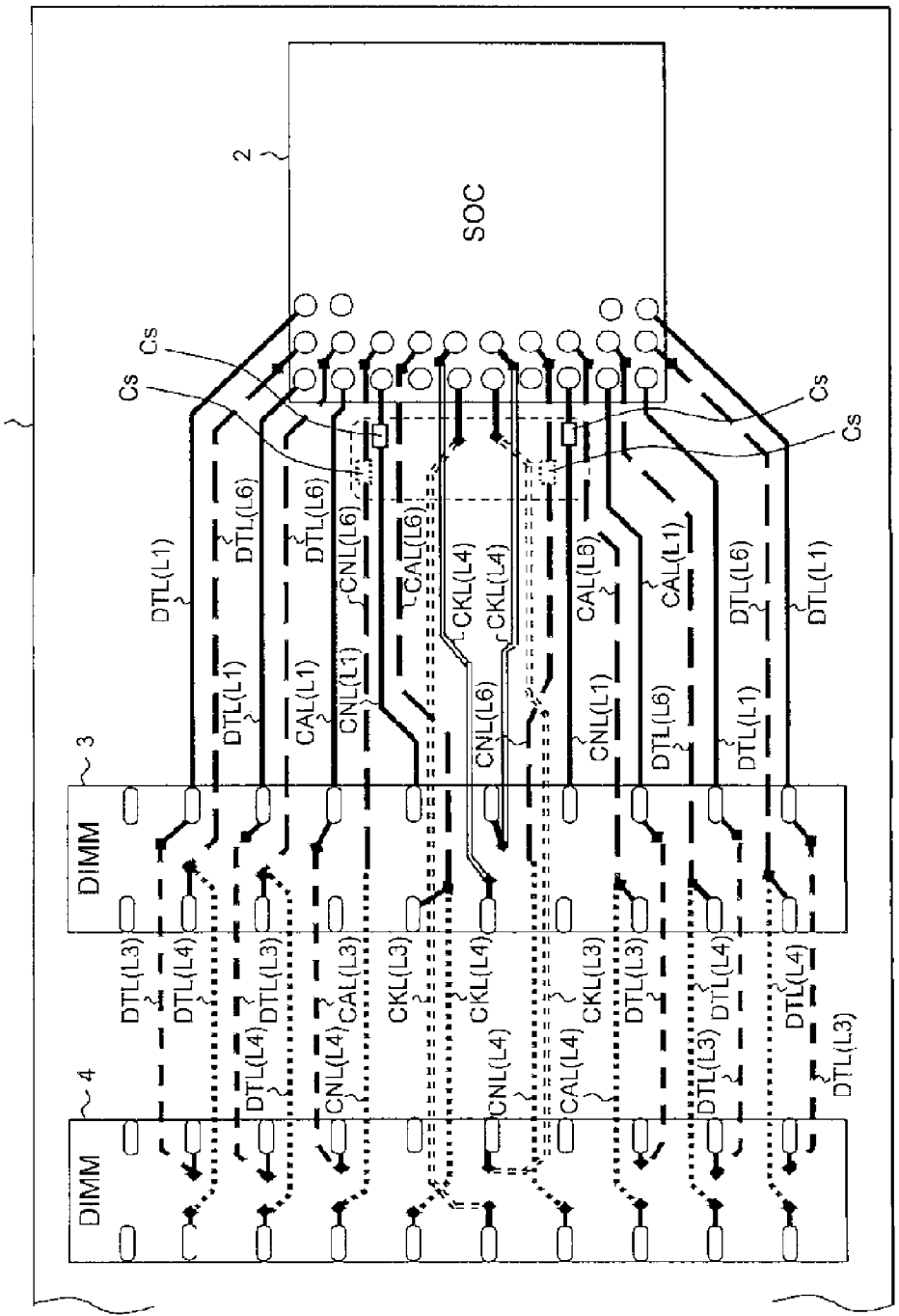
FIG. 12 is a plan view showing in detail a planar structure of the control board in FIG. 1.

FIG. 12 shows a planar structure of the control board in FIG. 1 in detail.

In FIG. 12, a clock wire CKL (L3) formed in the wiring layer L3 and a clock wire CLK (L4) formed in the wiring layer L4 are shown representatively as the clock transmission path CKL. As the command/address transmission path CAL, a command/address wire CAL (L1) formed in the wiring layer L1, a command/address wire (CAL) (L6) formed in the wiring layer L6, etc., are shown representatively. As the data system transmission path DTL, a data system wiring DTL (L1) formed in the wiring layer L6, a data system wiring DTL (L6) formed in the wiring layer L6, etc., are shown representatively. As the control system transmission path CNL, a control system wiring CNL (L1) formed in the wiring layer L6, a control system wiring CNL (L6) formed in the wiring layer L6, etc., are shown representatively.

In the vicinity of the microcomputer 2, the capacitor element Cs is coupled to the control system wirings CNL (L1), CNL (L6).

Figure 13:
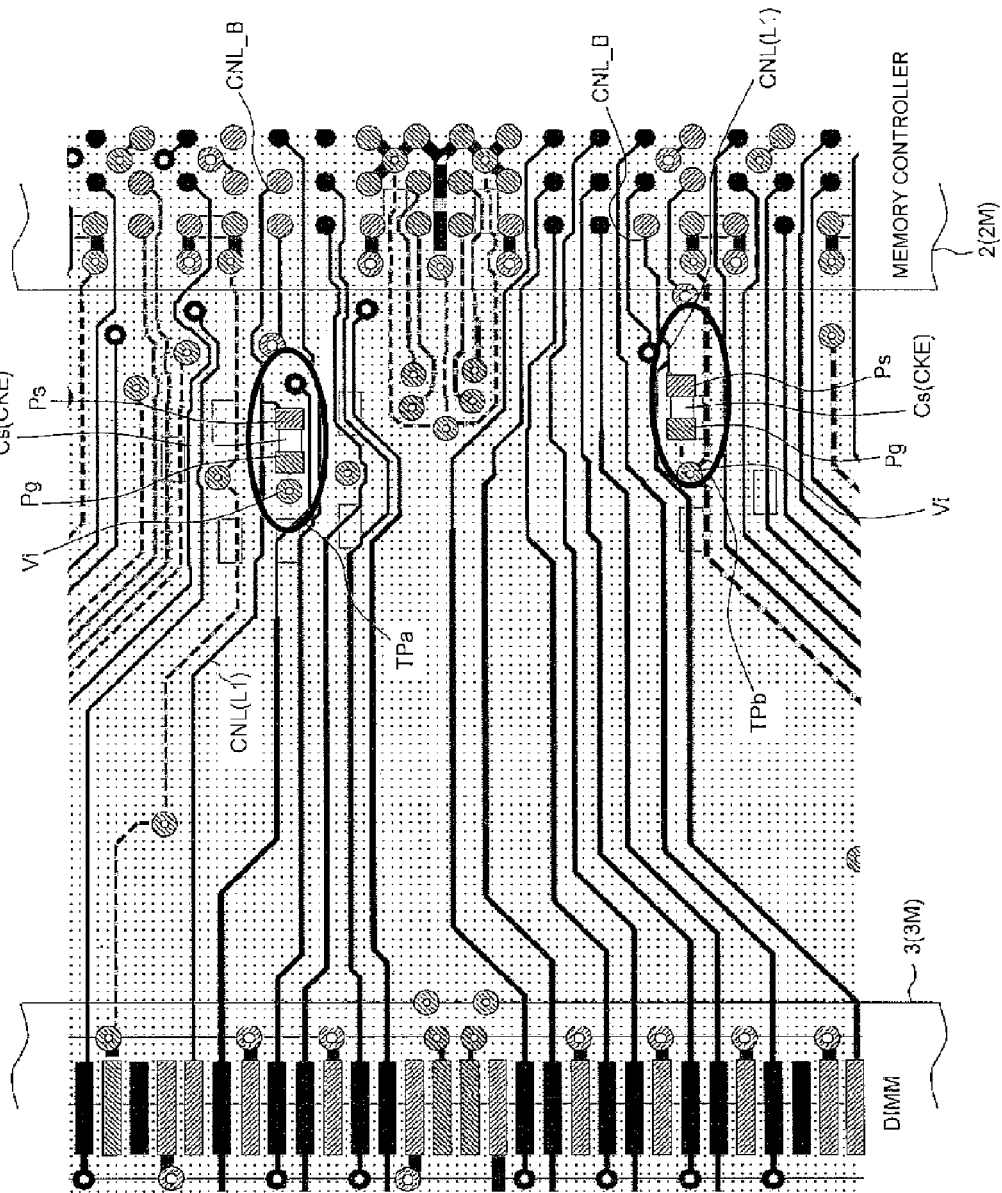
FIG. 13 is a plan view illustrating in detail a wiring pattern in the vicinity of a capacitor element on the mounting surface on a circuit substrate mounting SOC or DIMM.

FIG. 13 illustrates a wiring pattern in detail in the vicinity of the capacitor element on the package surface on the circuit substrate mounting SOC and DIMM.

A capacitor element Cs (CKE) illustrated at a part TPa is a capacitor element coupled to the control system wiring CNL (L1) and used here, for example, to relax the through rate of the clock enable signal CKE transmitted to the control system wiring CNL (L1). Ps denotes an electrode pad to be coupled to the control system wiring CNL (L1), Pg denotes an electrode pad to be coupled to the ground plane L2 (GND) via the via wire Vi, and the capacitive electrodes of the respective capacitor elements Cs (CKE) are fixed on the electrodes pads Ps, Pg with solder etc. As the capacitor element Cs (CKE), a chip capacitor etc. may be used and this also applies to a part denoted by TPb.

Figure 14:
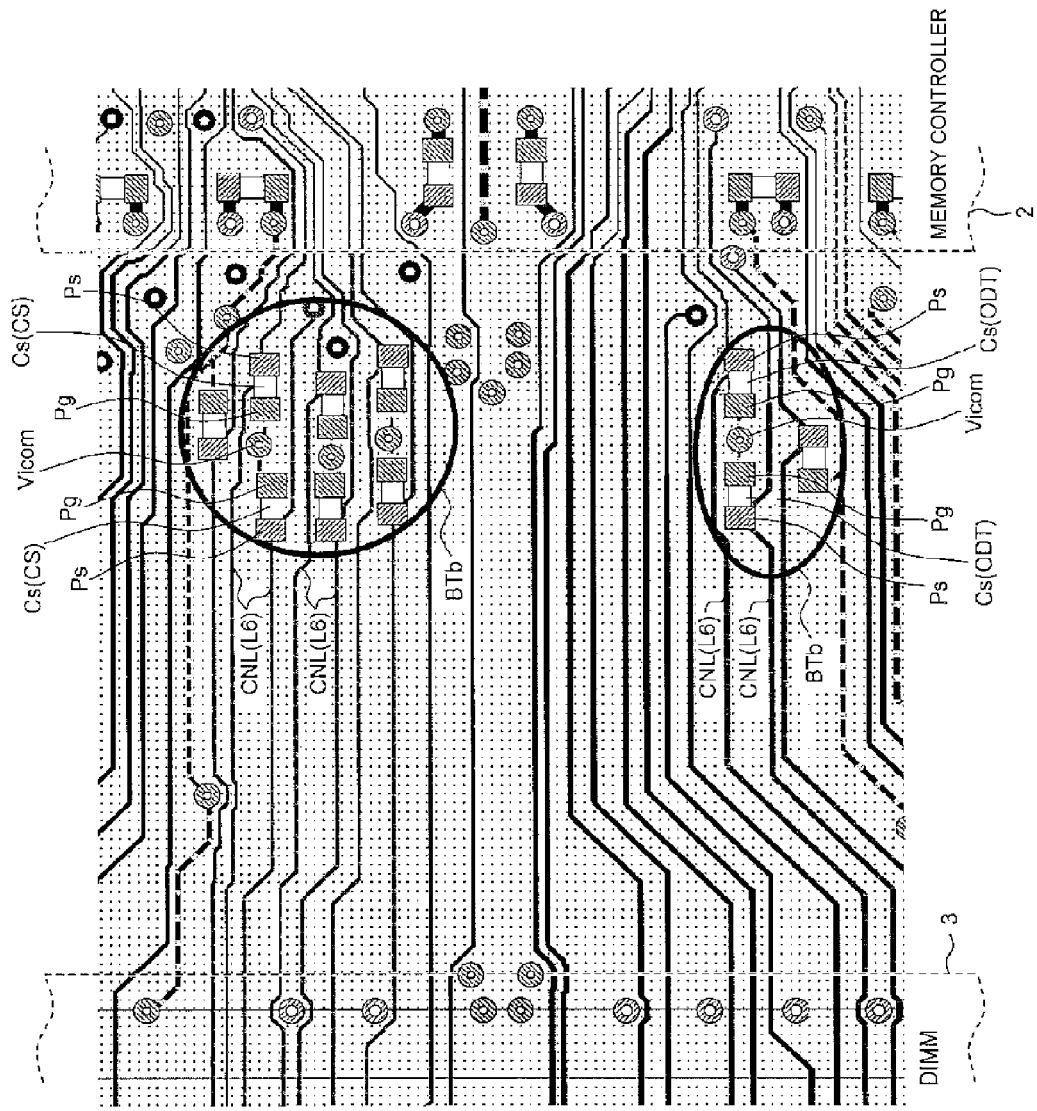
FIG. 14 is a plan view illustrating in detail a wiring pattern in the vicinity of a capacitor element on the back surface of a circuit substrate.

FIG. 14 illustrates a wiring pattern in detail in the vicinity of the capacitor element on the back surface on the circuit substrate mounting SOC and DIMM.

A capacitor element Cs (CS) illustrated at a part BTa is a capacitor element coupled to the control system wiring CNL (L6) and used here, for example, to relax the through rate of the chip select signal CS transmitted to the control system wiring CNL (L6). Ps denotes an electrode pad coupled to the control system wiring CNL (L6) and Pg denotes an electrode pad coupled to the ground plane L2 (GND) via a via wire Vicom. Here, the control system wirings CNL (L6) to which the capacitor element Cs (Cs) should be coupled aggregate densely, and therefore, the two electrode pads Pg are coupled commonly to the one via wire Vicom to make an attempt to improve the efficiency of the use of area.

A capacitor element Cs (ODT) illustrated at the part BTb is a capacitor element coupled to the control system wiring CNL (L6) and used here, for example, to relax the through rate of the on-die termination signal ODT transmitted to the control system wiring CNL (L6). Ps denotes an electrode pad coupled to the control system wiring CNL (L6) and Pg denotes an electrode pad to be coupled to the ground plane L2 (GND) via the via wire Vicom. Similarly to the above, the control system wirings CNL (L6) to which the capacitor element Cs (ODT) should be coupled aggregate densely, and therefore, the two electrode pads Pg are coupled commonly to the one via wire Vicom to make an attempt to improve the efficiency of the use of area.

In FIG. 11 and FIG. 13, CNL_B denotes the starting point in the direction of signal transmission of the control system wirings CNL (L1), CNL (L6). The signal transmission direction starting point CNL_B corresponds to a coupling end part of the electrode pad 12, which is a terminal on which the solder bump 27, which is part of the microcomputer 2, is mounted and the control system wirings CNL (L1), CNL (L6).

The invention made by the inventors of the present invention is explained specifically as above based on the embodiments, however, it is needless to say that the present invention is not limited to those and there can be various modifications in the scope not deviating from its gist.

For example, the total number of wirings on the wiring board is not limited to six and eight or more layers are accepted.

In the above-mentioned embodiments, the wiring board (substrate) 1 on which a plurality of DIMMs is mounted is explained, however, it may also be possible for only one DIMM to be mounted on the one microcomputer 2.

In the above-mentioned embodiments, the control board or system board on which the semiconductor component mounted on the circuit substrate and the semiconductor turned into a module are mounted is explained as an example, however, the present invention is not limited to the example and can be applied to an electronic device as a so-called SIP (System In Package) semiconductor, in which a semiconductor component such as a control chip and a semiconductor component in a memory system having a plurality of memory chips are mounted on one interposer substrate (wiring substrate). The application scope of an electronic device includes a video camera, digital still camera, portable terminal, etc., not limited to a printer or image scanner.

In the above-mentioned embodiments, although the case is explained where the capacitor element Cs is configured by a chip component such as a chip capacitor, it is also possible to constitute a capacitor element using a wiring pattern of the wiring layer of the circuit substrate. However, in order to relax the through rate of a signal by removing the harmonic component, a capacitance value of at least 3 pF is necessary, and when this is formed by a wiring pattern, it is necessary to form a very large wiring pattern, and therefore, it is not practical and from the viewpoint of downsizing of an electronic device, it is preferable to use a chip component as in the above-mentioned embodiments.

What is claimed is:

1. An electronic device comprising:
a substrate having a plurality of first terminals formed in a first semiconductor component mounting region, a plurality of second terminals formed in a second semiconductor component mounting region, and transmission paths coupling the first terminals and the second terminals, respectively;
a first semiconductor component mounted in the first semiconductor component mounting region; and
a second semiconductor component mounted in the second semiconductor component mounting region,
wherein the second semiconductor component has plurality of memory devices operated in synchronization with a clock signal,
wherein the first semiconductor component has a memory controller controlling the second semiconductor component,
wherein the transmission paths include a clock transmission path to supply the clock signal from the first semiconductor component to the second semiconductor component, a command/address transmission path to supply a command and address signal from the first semiconductor component to the second semiconductor component, a data system transmission path to transmit data between the first semiconductor component and the second semiconductor component, and a first control system transmission path to transmit a first control system signal to indicate the validity of the clock signal and the command and address signal from the first semiconductor component to the second semiconductor component,
wherein the substrate further has a ground plane, a first specific transmission path branching from the middle of the first control system transmission path and reaching the ground plane, and a first capacitor element arranged in series with the first specific transmission path, and
wherein the first capacitor element has a capacitance value greater than a parasitic capacitance of a path from the proximal end in the direction of signal transmission of the first control system transmission path to the branching point to the first specific transmission path.

2. The electronic device according to claim 1,
wherein the distance from the first semiconductor component on the first control system transmission path to the branching point to the first specific transmission path is shorter than the distance from the branching point on the first control system transmission path to the second semiconductor component.

3. The electronic device according to claim 1,
wherein the second semiconductor component is a memory module in which the memory devices are mounted on a module substrate, and
wherein to a clock wire within the module substrate receiving the clock signal supplied from the clock transmission path, to a signal line within the module substrate receiving the command and address signal supplied from the command/address transmission path, and to a signal line within the module substrate receiving the first control system signal from the first control system transmission path, corresponding terminals of the memory devices are coupled in a fly-by topology.

4. The electronic device according to claim 3,
wherein the memory device is DDR3-SDRAM, and
wherein the first control system signal is a chip select signal and a clock enable signal in the DDR3-SDRAM.

5. The electronic device according to claim 1,
wherein the transmission paths further include a second control system transmission path to transmit a second control system signal to selectively switch the transmission characteristics of the data system transmission path from the first semiconductor component to the second semiconductor component,
wherein the substrate further includes a second specific transmission path branching from the middle of the second control system transmission path and reaching a ground plane, and a second capacitor element arranged in series with the second specific transmission path, and
wherein the second capacitor element has a capacitance value greater than a parasitic capacitance of a path from the proximal end in the direction of signal transmission of the second control system transmission path to the branching point to the second specific transmission path.

6. The electronic device according to claim 5,
wherein the distance from the first semiconductor component on the second control system transmission path to the branching point to the second specific transmission path is shorter than the distance from the branching point on the second control system transmission path to the second semiconductor component.

7. The electronic device according to claim 5,
wherein the second semiconductor component is a memory module in which the memory devices are mounted on a module substrate, and
wherein to a clock wire within the module substrate receiving the clock signal supplied from the clock transmission path, to a signal line within the module substrate receiving the command and address signal supplied from the command/address transmission path, to a signal line within the module substrate receiving the first control system signal from the first control system transmission path, and to a signal line within the module substrate receiving the second control system signal supplied form the second control system transmission path, corresponding terminals of the memory devices are coupled in a fly-by topology.

8. The electronic device according to claim 7,
wherein the second semiconductor component is DDR3-SDRAM,
wherein the memory device has an on-die termination that can be utilized as a termination resistor corresponding to the data system transmission path, and
a select signal input from the input terminal is an on-die termination specifying signal to specify validity or invalidity of the on-die termination.

9. The electronic device according to claim 5,
wherein the substrate has a plurality of wiring layers,
wherein the first control system transmission path and the second control system transmission path are formed in wiring layers in the uppermost layer and the lowermost layer of the wiring layers, respectively, and
wherein the first terminals and the second terminals are each formed in the uppermost layer of the wiring layers.

10. The electronic device according to claim 9,
wherein the ground plane is formed in a wiring layer of an inner layer between the uppermost layer and the lowermost layer of the wiring layers,
wherein the specific transmission paths are electrically coupled to the ground plane, respectively, via a via wire provided in a through hole formed in the substrate, and
wherein the via wires are commonly coupled, respectively, to wires adjacent to each other included in the first control system transmission path and the second control system transmission path in the planar view.

11. An electronic device in which a first semiconductor component and a second semiconductor component controlled by the first semiconductor component are mounted on a substrate,
wherein the second semiconductor component has a plurality of memory devices operated in synchronization with a clock signal,
wherein the substrate has a plurality of signal paths to couple the second semiconductor component to the first semiconductor component,
wherein the signal paths include a clock transmission path to supply the clock signal from the first semiconductor component to the second semiconductor component, a command/address transmission path to supply a command and address signal from the first semiconductor component to the second semiconductor component, a data system transmission path to transmit data between the first semiconductor component and the second semiconductor component, and a first control system transmission path to transmit a first control system signal to indicate the validity of the clock signal and the command and address signal from the first semiconductor component to the second semiconductor component,
wherein the substrate further has a ground plane, specific transmission path branching from the middle of the first control system transmission path and reaching the ground plane, and a capacitor element arranged in series with the specific transmission path, and
wherein the capacitor element makes smaller the through rate and makes larger the timing window of the first control system signal compared to those when the capacitor element is not provided.

12. The electronic device according to claim 11,
wherein the transmission paths further include a second control system transmission path to transmit a second control system signal to selectively switch the transmission characteristics of the data system transmission path from the first semiconductor component to the second semiconductor component,
wherein the substrate further has a second specific transmission path branching from the middle of the second control system transmission path and reaching a ground plane and a second capacitor element arranged in series in the middle of the second specific transmission path, and
wherein the second capacitor element makes smaller the through rate and makes larger the timing window of the second control system signal compared to those when the second capacitor element is not provided.

13. The electronic device according to claim 12,
wherein the second semiconductor component is a memory module in which the memory devices are mounted on a module substrate, and
wherein to a clock wire within the module substrate receiving the clock signal supplied from the clock transmission path, to a signal line within the module substrate receiving the command and address signal supplied from the command/address transmission path, and to a signal line within the module substrate receiving the first control system signal from the first control system transmission path, corresponding terminals of the memory devices are coupled in a fly-by topology.

14. The electronic device according to claim 13,
wherein in the second semiconductor component, to a signal line within the module substrate receiving a second control system signal supplied from the second control system transmission path, corresponding terminals of the memory devices are coupled in a fly-by topology.

15. The electronic device according to claim 14,
wherein the memory device is DDR 3-SDRAM, and
wherein the first control system signal is a chip select signal and a clock enable signal in DDR 3-SDRAM.

16. The electronic device according to claim 15,
wherein the memory device has an on-die termination that can be utilized as a termination resistor corresponding to the data system transmission path, and
a select signal input from the input terminal is an on-die termination specifying signal to specify validity or invalidity of the on-die termination.

* * * * *